(12) United States Patent
Inada et al.

(10) Patent No.: US 10,685,832 B1
(45) Date of Patent: Jun. 16, 2020

(54) SUBSTRATE PROCESSING APPARATUS

(71) Applicant: KOKUSAI ELECTRIC CORPORATION, Tokyo (JP)

(72) Inventors: Tetsuaki Inada, Toyama (JP); Naofumi Ohashi, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/557,442

(22) Filed: Aug. 30, 2019

(30) Foreign Application Priority Data

Mar. 12, 2019  (JP) ................................. 2019-044677

(51) Int. Cl.
*H01L 21/02* (2006.01)
*H01L 21/677* (2006.01)

(52) U.S. Cl.
CPC .. *H01L 21/02271* (2013.01); *H01L 21/02123* (2013.01); *H01L 21/02208* (2013.01); *H01L 21/67754* (2013.01)

(58) Field of Classification Search
CPC ......... H01L 21/02271; H01L 21/02123; H01L 21/02208; H01L 21/67754

USPC ........................................................ 438/778
See application file for complete search history.

(56) References Cited

U.S. PATENT DOCUMENTS

| | | | |
|---|---|---|---|
| 2013/0078823 A1 | 3/2013 | Takeshima et al. | |
| 2016/0032457 A1* | 2/2016 | Tanabe | C23C 16/4585 118/666 |
| 2016/0379868 A1* | 12/2016 | Sato | H01L 21/76802 438/703 |
| 2018/0374672 A1* | 12/2018 | Hayashi | H01J 37/32724 |

FOREIGN PATENT DOCUMENTS

JP    2013-084898 A    5/2013

\* cited by examiner

*Primary Examiner* — Didarul A Mazumder
(74) *Attorney, Agent, or Firm* — Volpe and Koenig, P.C.

(57) ABSTRACT

There is provided a technique that includes a metal container including a process chamber configured to process a substrate, a substrate mounting plate rotatably installed in the container and having a plurality of substrate mounting surfaces circumferentially arranged at an upper surface thereof, a heater configured to heat the substrate mounted on each of the plurality of substrate mounting surfaces, a heat attenuator installed between the heater and the container, a gas supply part configured to supply a gas to the process chamber, and a support part configured to rotate the substrate mounting plate.

8 Claims, 9 Drawing Sheets

| | Absorption rate against wavelength | |
|---|---|---|
| | 1 μm | 1.6 μm |
| Aluminum alloy | — | 0.4 |
| Stainless steel | 0.35 | 0.2~0.9 |

US 10,685,832 B1

SUBSTRATE PROCESSING APPARATUS

CROSS-REFERENCE TO RELATED APPLICATION

This application is based upon and claims the benefit of priority from Japanese Patent Application No. 2019-044677, filed on Mar. 12, 2019, the entire contents of which are incorporated herein by reference.

TECHNICAL FIELD

The present disclosure relates to a substrate processing apparatus.

BACKGROUND

As an apparatus for processing a semiconductor substrate, there is known a rotary apparatus in which a plurality of substrates is arranged in a circumferential direction on a rotary tray and the substrate mounting part thereof is rotated to sequentially supply two types of gases to the plurality of substrates. When supplying the gases, the substrate is heated by a heating part.

In the rotary apparatus, for example, 300 mm substrates are processed. Since the 300 mm substrates are arranged in the circumferential direction, the apparatus itself becomes large. Therefore, a metal which is easy to process is used as a material of a container of the apparatus. In addition, when the 300 mm substrates are arranged in the circumferential direction, the weight is increased, so that the rotary tray is supported by a metal so as to withstand the weight.

When processing the substrate, heat treatment is performed. At this time, since the container of the apparatus and the support portion for supporting the rotary tray are made of a metal, heat is accumulated in the container and the support portion, whereby the container and the support portion are thermally expanded. As a result, there is a possibility that the positional deviation of components may occur.

SUMMARY

Some embodiments of the present disclosure provide a technique capable of reducing the influence of thermal expansion in a rotary apparatus.

According to some embodiments of the present disclosure, there is provided a technique that includes a metal container including a process chamber configured to process a substrate, a substrate mounting plate rotatably installed in the container and having a plurality of substrate mounting surfaces circumferentially arranged at an upper surface of the substrate mounting plate, a heater configured to heat the substrate mounted on each of the plurality of substrate mounting surfaces, a heat attenuator installed between the heater and the container, a gas supply part configured to supply a gas to the process chamber, and a support part configured to rotate the substrate mounting plate.

DETAILED DESCRIPTION

Figure 1:
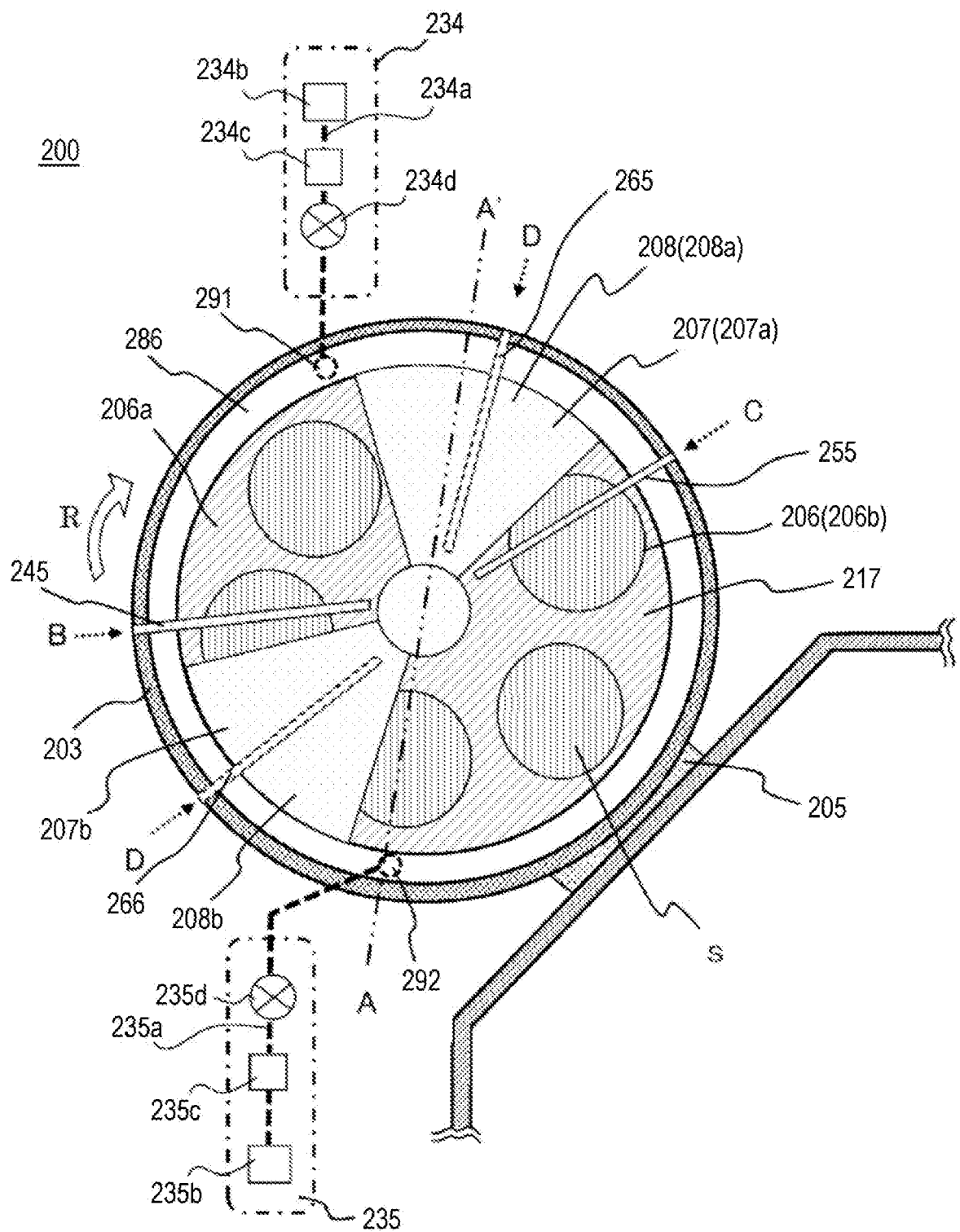
FIG. 1 is a schematic view showing a horizontal cross section of a reactor provided in a substrate processing apparatus according to an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Figure 2:
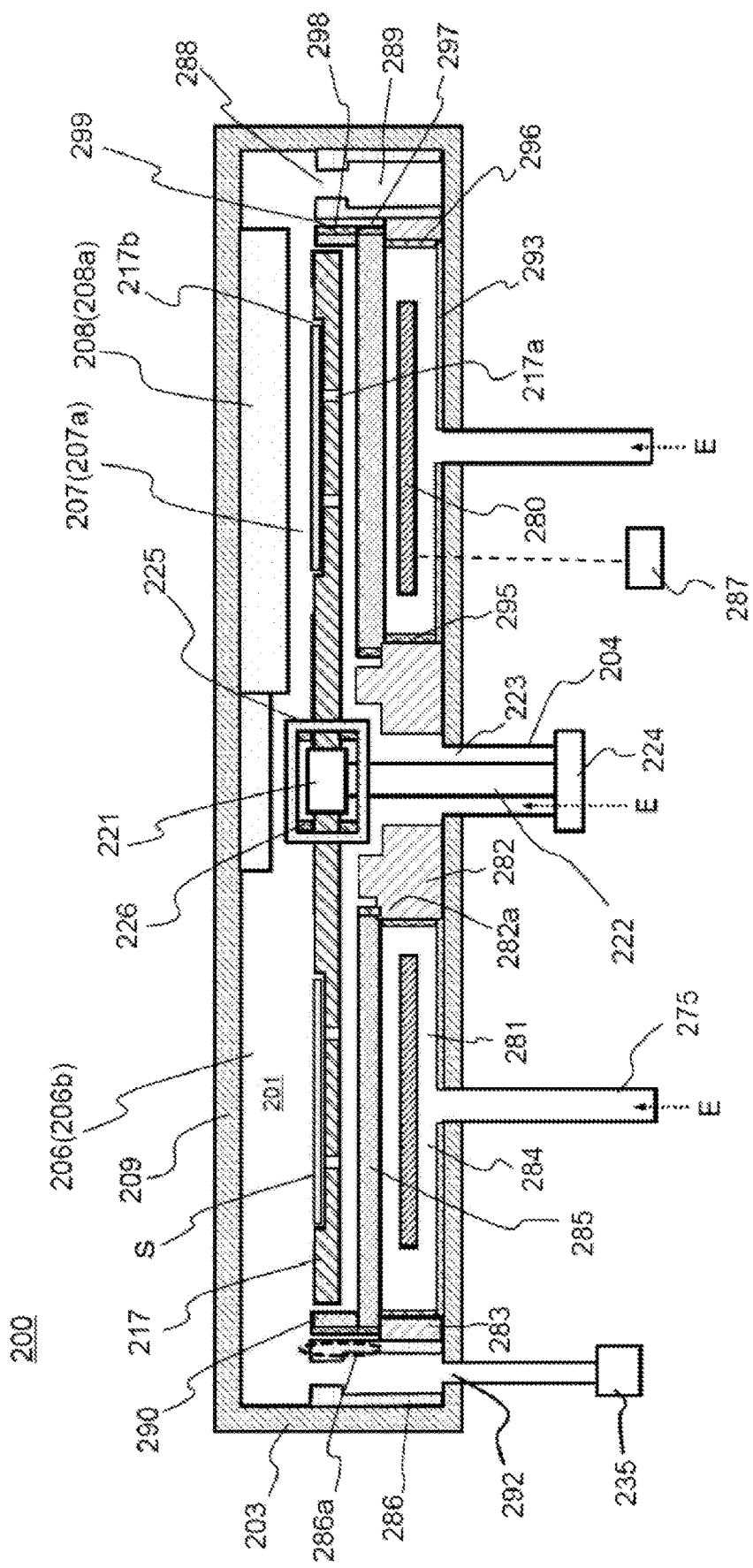
FIG. 2 is a schematic view showing a vertical cross section of the reactor provided in the substrate processing apparatus according to an embodiment of the present disclosure, which is a cross sectional view taken along line A-A' in the reactor shown in FIG. 1.

The configuration of a reactor as a process furnace according to the present embodiment will be described mainly with reference to FIGS. 1 to 10. FIG. 1 is a schematic view showing a horizontal cross section of a reactor 200 as a substrate processing apparatus according to the present embodiment. FIG. 2 is a schematic view showing a vertical cross section of the reactor 200 according to the present embodiment, which is a cross sectional view taken along line A-A' of the reactor shown in FIG. 1. The line A-A' is a line extending from A to A' through the center of a container 203.

Figures 3, 4:
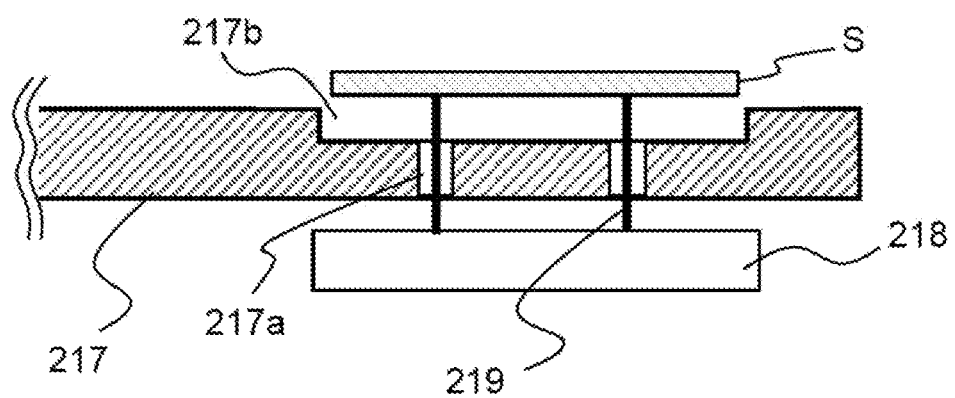
FIG. 3 is an explanatory view for explaining a substrate support mechanism according to an embodiment of the present disclosure.
FIG. 4 is an explanatory view for explaining the absorption rates of metals.
Figure 5A:
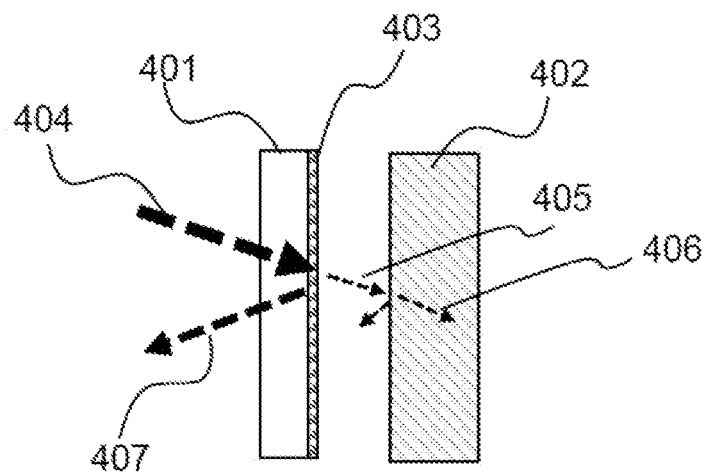
FIGS. 5A and 5B are explanatory views for explaining a heat attenuator according to an embodiment of the present disclosure.
Figure 5B:
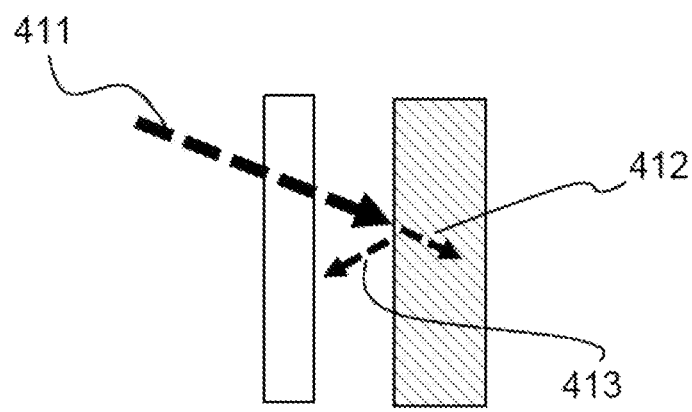
Figure 9:
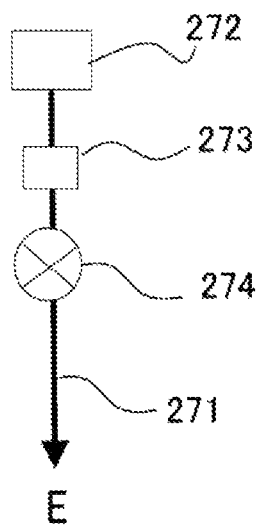
FIG. 9 is an explanatory view for explaining a second inert gas supply part according to an embodiment of the present disclosure.
Figure 10:
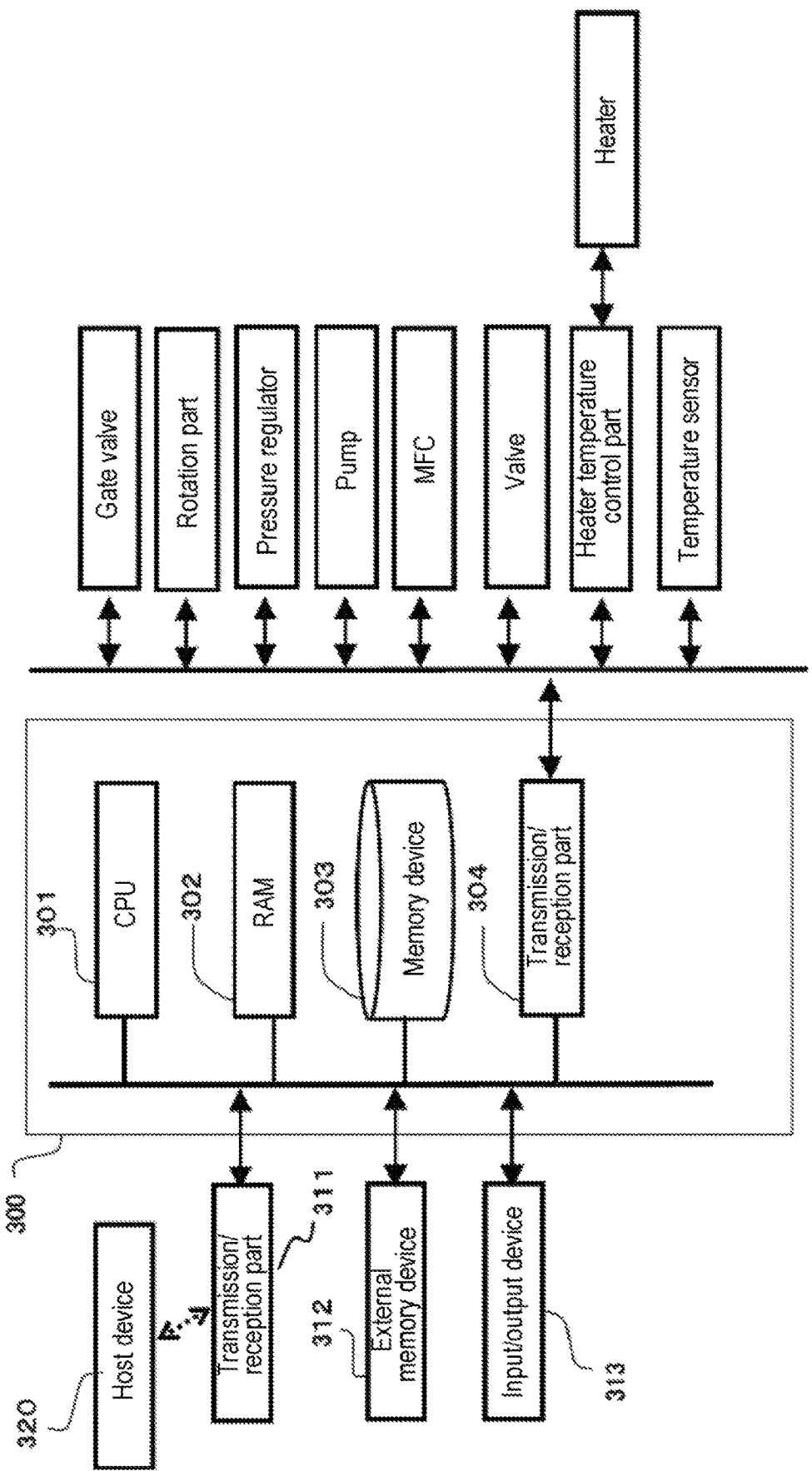
FIG. 10 is an explanatory view for explaining a controller according to an embodiment of the present disclosure.

FIG. 3 is an explanatory view for explaining a substrate support mechanism. FIG. 4 and FIGS. 5A and 5B are explanatory views for explaining a heat attenuator. FIGS. 6 to 9 are explanatory views for explaining a gas supply system. FIG. 10 is an explanatory view for explaining a controller.

The specific configuration of the reactor 200 will be described. As shown in FIGS. 1 and 2, the reactor 200 includes a container 203 which is a cylindrical airtight vessel. Therefore, a metal which is easy to process is used as the material of the container of the apparatus. In addition, when 300 mm substrates are arranged in the circumferential direction, the weight is increased, so that a rotary tray is supported by a metal so as to withstand the weight. For example, the rotary tray is made of stainless steel (SUS), an aluminum alloy or the like. In the container 203, there is provided a process chamber 201 for processing substrates S. A gate valve 205 is connected to the container 203, and the substrates S are loaded into or unloaded from the container 203 via the gate valve 205.

The process chamber 201 has a process region 206 to which a process gas is supplied and a purge region 207 to which a purge gas is supplied. In the present embodiment, the process region 206 and the purge region 207 are alternately arranged in the circumferential direction. For example, a first process region 206a, a first purge region 207a, a second process region 206b and a second purge region 207b are arranged in the order named. As will be described later, a precursor gas is supplied into the first process region 206a, a reaction gas is supplied into the second process region 206b, and an inert gas is supplied into the first purge region 207a and the second purge region 207b. Thus, the substrate S is subjected to predetermined processes according to the gases supplied into the respective regions.

The purge region 207 is for spatially dividing the first process region 206a and the second process region 206b. A ceiling 208 of the purge region 207 is configured to be lower than a ceiling 209 of the process region 206. A ceiling 208a is installed on the first purge region 207a, and a ceiling 208b is installed on the second purge region 207b. By lowering the respective ceilings, a spatial pressure of the purge region 207 is increased. By supplying a purge gas to this space, the adjacent process region 206 is partitioned. Further, the purge gas has a role of removing an excess gas on the substrate S.

At the center of the container 203, there is installed, for example, a substrate mounting plate 217 with a rotation axis at the center of the container 203 and configured to be rotatable. The substrate mounting plate 217 is formed of, for example, a material such as quartz, carbon or SiC so that the substrate S is not affected by metal contamination.

The substrate mounting plate 217 is configured such that a plurality of (for example, six) substrates S can be arranged on the same plane and in the same circumference along a rotational direction inside the container 203. The "same plane" referred to here is not limited to the completely same plane. It will suffice that the substrates S are arranged so as not to overlap with each other when the substrate mounting plate 217 is viewed from above.

Recesses 217b are provided at the support positions of the substrates S on the surface of the substrate mounting plate 217. The recesses 217b of the same number as the number of substrates S to be processed are arranged at the positions concentric from the center of the substrate mounting plate 217 at equal intervals (e.g., at intervals of 60°). In FIG. 1, the illustration of the recesses 217b is omitted for the convenience of explanation.

For example, each recess 217b has a circular shape when viewed from above the substrate mounting plate 217 and has a concave shape when viewed from the lateral side of the substrate mounting plate 217. The diameter of the recesses 217b is desirably set to be slightly larger than the diameter of the substrate S. A substrate mounting surface is provided at the bottom of the recess 217b. The substrate S can be mounted on the substrate mounting surface by mounting the substrate S in the recess 217b. Each recess 217b is provided with a plurality of through holes 217a through which pins 219 described later can pass.

A substrate holding mechanism 218 shown in FIG. 3 is provided in the container 203 below the substrate mounting plate 217 at a position facing the gate valve 205. The substrate holding mechanism 218 has a plurality of pins 219 for supporting the back surface of the substrate S by pushing up the substrate S at the time of loading and unloading of the substrate S. The pins 219 are configured to be extendable and can be accommodated in, for example, the main body of the substrate holding mechanism 218. When transferring the substrate S, the pins 219 are extended to penetrate the through holes 217a and to hold the substrate S. Thereafter, the leading ends of the pins 219 move downward to mount the substrate S in the recess 217b. The substrate holding mechanism 218 is fixed to, for example, the container 203. The substrate holding mechanism 218 may have any configuration as long as the pins 219 can be inserted into the through holes 217a at the time of mounting the substrate. The substrate holding mechanism 218 may be fixed to an inner peripheral convex portion 282 or an outer peripheral convex portion 283 described later.

The substrate mounting plate 217 is fixed to a core portion 221. The core portion 221 is provided at the center of the substrate mounting plate 217 and plays a role of fixing the substrate mounting plate 217. Since the core portion 221 has a structure for supporting the substrate mounting plate 217, a metal is used so as to withstand the weight. A shaft 222 is disposed below the core portion 221. The shaft 222 supports the core portion 221.

The lower side of the shaft 222 is configured to penetrate a hole 223 provided at the bottom of the container 202 and is covered with an airtight container 204 outside the container 203. Furthermore, the lower end of the shaft 222 is connected to a rotation part 224. The rotation part 224 is configured to mount a rotation shaft, a motor and the like, and is configured to be able to rotate the substrate mounting plate 217 by an instruction of a controller 300 to be described later.

A quartz cover 225 is provided to cover the core portion 221. That is, the quartz cover 225 is provided between the core portion 221 and the process chamber 201. The quartz cover 225 is configured to cover the core portion 221 via a space. A heat attenuator 226 is coated on the quartz cover 225 toward the core portion 221. The quartz cover 225 is formed of, for example, a material such as quartz or SiC so that the substrate S is not affected by metal contamination. Details of the heat attenuator 226 will be described later. The core portion 221, the shaft 222, the rotation part 224 and the quartz cover 225 will be collectively referred to as a support part.

Below the substrate mounting plate 217, there is disposed a heater unit 281 including a heater 280 as a heating part. The heater 280 heats each substrate S mounted on the substrate mounting plate 217. The heater 280 is annularly formed in conformity with the shape of the container 203.

The heater unit 281 is mainly composed of a heater 280, an inner peripheral convex portion 282 provided above the bottom of the container 203 at the center side of the container 203, and an outer peripheral convex portion 283 provided more outward than the heater 280. The inner peripheral convex portion 282, the heater 280, and the outer peripheral convex portion 283 are disposed concentrically. A space 284 is defined between the inner peripheral convex portion 282 and the outer peripheral convex portion 283. The heater 280 is disposed in the space 284. Since the inner peripheral convex portion 282 and the outer peripheral convex portion 283 are also fixed to the container 203, they may be considered as parts of the container 203.

Although the heater 280 having an annular shape is described here, the heater 280 is not limited as long as it can heat the substrate S. The heater 280 may be divided into a plurality of parts.

A flange 282a is formed in the upper portion of the inner peripheral convex portion 282 on the side of the heater 280. A window 285 is supported on the flange 282a and the upper surface of the outer peripheral convex portion 283. The window 285 is made of a material that transmits the heat generated from the heater 280, for example, quartz. The window 285 is fixed by being sandwiched between the upper portion 286a of an exhaust structure 286 to be described later and the inner peripheral convex portion 282. At this time, spaces are provided between the window 285 and the inner peripheral convex portion 282, and between the window 285 and the upper portion 286a of the exhaust structure 286. The reason for providing the spaces will be described later.

A heater control part 287 is connected to the heater 280. The heater control part 287 is electrically connected to a controller 300 described later and is configured to control electric power supply to the heater 280 by an instruction of the controller 300, thereby performing temperature control.

At the bottom of the container 203, there is provided an inert gas supply pipe 275 communicating with the space 284. The inert gas supply pipe 275 is connected to an inert gas supply part 270 described later. The inert gas supplied from the inert gas supply part 270 is supplied to the space 284 via the inert gas supply pipe 275. The space 284 is kept in an inert gas atmosphere to prevent a process gas from entering the space 284 through a gap or the like in the vicinity of the window 285.

A metal exhaust structure 286 is disposed between the outer circumferential surface of the outer peripheral convex portion 283 and the inner circumferential surface of the container 203. The exhaust structure 286 has an exhaust groove 288 and an exhaust buffer space 289. The exhaust groove 288 and the exhaust buffer space 289 are formed in an annular shape in conformity with the shape of the container 203.

The portion of the exhaust structure 286, which is not in contact with the outer peripheral convex portion 283, will be referred to as an upper portion 286a. As described above, the upper portion 286a fixes the window 285 in cooperation with the inner peripheral convex portion 282.

In the rotary substrate processing apparatus according to the present embodiment, it is desirable to make the height of the substrate S equal to the height of the exhaust port or to make the height close to each other. If the height of the exhaust port is low, a turbulent flow of a gas may be generated at the end portion of the substrate mounting plate. In contrast, by making the height equal to each other or making the height close to each other, a turbulent flow is prevented from being generated at the substrate edge on the side of the exhaust port.

In the present embodiment, the upper end of the exhaust structure 286 has the same height as the substrate mounting plate 217. In this case, as shown in FIG. 2, there is a region where the upper portion 286a protrudes from the window 285. Therefore, from the viewpoint of preventing particle diffusion, a quartz cover 290 is provided in the region. If the quartz cover 290 is not provided, the gas may come into contact with the upper portion 286a and the upper portion 286a may be corroded to generate particles in the process chamber 201. A space 299 is provided between the quartz cover 290 and the upper portion 286a. The reason for providing the space 299 will be described later. The quartz cover 290 is also referred to as a first cover or a first quartz cover. In addition, the aforementioned quartz cover 225 is also referred to as a second cover or a second quartz cover.

At the bottom of the exhaust structure 286, there are provided an exhaust port 291 and an exhaust port 292. The exhaust port 291 mainly exhausts the precursor gas supplied to the process region 206a and the purge gas supplied from the upstream side thereof. The exhaust port 292 mainly exhausts the reaction gas supplied to the process region 206b and the purge gas supplied from the upstream side thereof. Each gas is exhausted from the exhaust port 291 and the exhaust port 292 via the exhaust groove 288 and the exhaust buffer space 289.

By the way, as described so far, the reactor 200 is mainly configured by metallic parts such as the container 203 and the convex member, and non-metallic parts such as the substrate mounting plate 217 and the window 285. The non-metallic parts are made of a material that hardly generates particles and can withstand a high temperature conditions, such as, for example, quartz, SiC or ceramic.

The thermal expansion coefficient of a metal is significantly greater than that of a non-metallic material such as, for example, quartz. Therefore, when heated to a predetermined temperature, a phenomenon in which quartz does not extend but only a metal extends occurs. In the apparatus according to the present embodiment, a shift may occur between the quartz part and the metallic part, thereby generating particles and the like.

Specifically, in the structure near the window 285, the inner peripheral convex portion 282 and the outer peripheral convex portion 283 may make contact with the window 285 due to the thermal expansion thereof. In the vicinity of the core portion 221, the substrate mounting plate 217 may be shifted by the thermal expansion of the core portion 221. When mounting the substrate S, the pins 219 and the through holes 217a may come into contact with each other. Particles are generated due to such contact and the like.

Thus, in the apparatus in which the quartz parts and the metallic parts are mixed, various problems occur due to the thermal expansion difference. Therefore, in the present embodiment, a heat attenuator for suppressing the thermal expansion of metallic parts may be provided at a region where the members having significantly different thermal expansion coefficients such as quartz and metal are adjacent to each other.

Next, the details of the heat attenuator will be described. In the present embodiment, there are a heat attenuator 226 installed around the core portion 221, heat attenuators 293, 295 and 296 installed at the heater unit 281, a heat attenuator 297 installed at the window 285, and a heat attenuator 298 installed at the quartz cover 290.

Subsequently, the properties of the heat attenuator will be described with reference to FIGS. 4 and 5. Each heat attenuator is constituted as a cover obtained by coating fine particles of quartz on the surface of a quartz part. By attaching fine particles of quartz glass as a cover, heat is scattered between the fine particles and is irregularly reflected. Therefore, the heat reflection performance is particularly high.

The coating of fine quartz particles is known to reflect 70% to 80% of electromagnetic waves having a wavelength of 1.0 μm to 2 μm, for example, when the thickness of the coating is about 200 μm.

FIG. 4 is a diagram showing absorption rates in metals against wavelengths. For example, the absorption rate of stainless steel for an electromagnetic wave having a wavelength of 1.0 μm is 0.35. In addition, for an electromagnetic wave having a wavelength of 1.6 µm, the absorption rate of aluminum alloy is 0.4, and the absorption rate of stainless steel is 0.2 to 0.9. Aluminum alloy and stainless steel are materials used in many substrate processing apparatuses. It can be seen that the absorption rates of metals are very high in these wavelength bands.

When reviewing the above reflection ratio and the contents of FIG. 4, it can be noted that the reflection ratio of fine quartz particles is extremely high for electromagnetic waves having a wavelength (of, for example, 1.0 to 1.6 µm) in which the absorption rate of aluminum alloy or stainless steel is high.

FIGS. 5A and 5B are explanatory views for explaining a reflection situation of electromagnetic waves. The reflection ratio of the electromagnetic waves in the quartz 401 is omitted for the convenience of explanation. In FIGS. 5A and 5B, the electromagnetic waves 404 and 411 are irradiated toward the quartz 401 and the metal 402. In FIG. 5A, the heat attenuator 403 made of fine quartz particles is coated on the surface of the quartz 401 facing the metal 402. The metal 402 is in a state in which the heat attenuator 403 is not present. FIG. 5B shows a state in which the heat attenuator is not coated on the quartz 401.

For example, when an electromagnetic wave having a wavelength of 1.0 µm is irradiated, the heat attenuator 403 reflects the electromagnetic wave 404 in the configuration shown in FIG. 5A. If the thickness of the heat attenuator 403 is about 200 µm, the heat attenuator 403 reflects about 80% of the electromagnetic wave 407. Therefore, the electromagnetic wave 405 reaching the metal 402 is attenuated to about 20%. The metal 402 is heated by the electromagnetic wave 406 transmitted through the heat attenuator 403.

On the other hand, when the heat attenuator 403 is not provided as shown in FIG. 5B, the electromagnetic wave 411 transmitted through the quartz 401 is partially reflected as an electromagnetic wave 413. However, the electromagnetic wave 412 which is hardly attenuated is absorbed by the metal 402. Thus, the energy absorbed in the case of FIG. 5B is significantly larger than that of FIG. 5A. Therefore, the temperature of the metal is higher than in the case of FIG. 5A.

Each heat attenuator according to the present embodiment attenuates the heat energy applied to the metallic parts using the quartz fine particle coating described above.

By the way, when the adjacent parts are metal, the difference in thermal expansion coefficient causes a shift between the quartz fine particle coating and the metal, which may generate particles. Thus, the respective heat attenuators are configured as follows.

The heat attenuator 226 is coated inside the quartz cover 225 toward the heater 280. The heat attenuator 226 attenuates the thermal energy applied to the core portion 221.

Moreover, the heat attenuator 226 is adjacent to the core portion 221 via a space. Since the quartz cover 225 is made of quartz, the thermal expansion coefficient of the quartz cover 225 is equal to that of the heat attenuator 226 made of fine quartz particles. Furthermore, since heat attenuator 226 is adjacent to the core portion 221 via a space, the heat attenuator 226 is not affected by the thermal expansion of the core portion 221. Therefore, the peeling of the coating due to the difference in the thermal expansion coefficient does not occur.

In addition, since the heat attenuating portion 226 is provided inside the quartz cover 225, the process gases do not adhere to the heat attenuator 226. Therefore, the generation of particles due to the corrosion or etching by the process gases does not occur.

By attenuating the thermal energy applied to the core portion 221 and suppressing the thermal expansion of the core portion 221 by such a configuration, it is possible to prevent the positions of the holes 217a formed in the substrate mounting plate 217 from being changed.

The heat attenuator 293 is coated on the bottom surface of the container 203, the heat attenuator 295 is coated on the surface of the inner peripheral convex portion 282 toward the space 284, and the heat attenuator 296 is coated on the surface of the outer peripheral convex portion 283 toward the space 284.

By providing the heat attenuators 293, 295 and 296, it is possible to reduce the heat energy applied from the heater 280 to the bottom surface of the container 203, the inner peripheral convex portion 282 and the outer peripheral convex portion 283. However, each heat attenuator is in contact with the metallic parts such as the container 203 and the like. Therefore, if the metallic parts are heated by long-time heating, particles may be generated due to the thermal expansion difference. On the other hand, in the present structure, the heat attenuator 293 is provided in the heater unit 281 and is separated from the process chamber 201 by the window 285. Therefore, even if particles and the like are generated in the heater unit 281, it is possible to suppress the diffusion of the particles and the like into the process chamber 201.

The heat attenuating portion 297 is coated on the outer circumferential surface of the window 285. That is, the heat attenuator 297 is provided in a region spaced apart from the process chamber 201 via the substrate mounting plate 217. By providing the heat attenuator 297 on the outer circumferential surface of the window 285, it is possible to attenuate the thermal energy applied from the heater 280 to the upper portion 286a and the convex portion of the inner peripheral convex portion 282. Since the window 285 is a quartz part, the thermal expansion coefficient of the window 285 is equal to that of the heat attenuator 297.

The upper portion 286a is adjacent to the heat attenuator 297 via the space 299. Therefore, even if heat is accumulated in the upper portion 286a by long-time heating and the upper portion 286a is expanded, the heat attenuator 297 is not affected by the expansion of the upper portion 286a. Accordingly, it is possible to suppress the peeling and the like of the coating which may be generated due to the contact or the like caused by the difference in thermal expansion coefficient. Even if the heat attenuator 297 is degraded and converted into particles due to the influence of heat or the like, the diffusion of the particles into the process chamber 201 can be prevented because the heat attenuator 297 is provided separately from the process chamber 201.

The heat attenuating portion 298 is formed on the outer periphery of the quartz cover 290. That is, the quartz cover 290 is provided between the heat attenuator 298 and the process chamber. By providing the heat attenuator 298 on the outer periphery of the quartz cover 290, it is possible to attenuate the thermal energy applied from the heater 280 to the upper portion 286a. Since the quartz cover 290 is a quartz part, the thermal expansion coefficient of the quartz cover 290 is equal to that of the heat attenuator 298. Furthermore, the heat attenuator 298 is adjacent to the upper portion 286a via the space 299. Therefore, even if heat is accumulated in the upper portion 286a by long-time heating and the upper portion 286a is expanded, the heat attenuator 298 is not affected by the expansion of the upper portion 286a. Accordingly, it is possible to suppress the peeling and the like of the coating which may be generated due to the difference in thermal expansion coefficient. Even if the heat attenuator 298 is degraded and converted into particles due to the influence of heat or the like, the diffusion of the particles into the process chamber 201 can be prevented because the quartz cover 290 is provided between the heat attenuator 298 and the process chamber 201.

Figure 6:
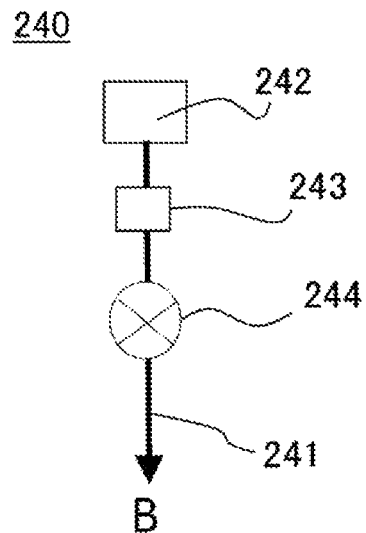
FIG. 6 is an explanatory view for explaining a precursor gas supply part according to an embodiment of the present disclosure.

Subsequently, the precursor gas supply part 240 will be described with reference to FIGS. 1 and 6. As shown in FIG. 1, a nozzle 245 is inserted through the lateral side of the container 203 toward the center of the container 203. The nozzle 245 is disposed in the first process region 206a. "B" denoted in FIG. 1 corresponds to "B" denoted in FIG. 6 for connection. The downstream end of the gas supply pipe 241 is connected to the nozzle 245.

In the gas supply pipe 241, a precursor gas supply source 242, a mass flow controller (MFC) 243 as a flow rate controller (flow rate control part) and a valve 244 as an opening/closing valve are provided sequentially from the upstream side.

The precursor gas is supplied from the gas supply pipe 241 into the first process region 206a through the MFC 243, the valve 244 and the nozzle 245.

The "precursor gas" referred to here is one of the process gases, and is a gas serving as a precursor at the time of thin film formation. The precursor gas contains, for example, at least one selected from the group of titanium (Ti), tantalum (Ta), silicon (Si), hafnium (Hf), zirconium (Zr), ruthenium (Ru), nickel (Ni) and tungsten (W), as an element constituting a thin film.

Specifically, in the present embodiment, the precursor gas is, for example, a dichlorosilane ($Si_2H_2Cl_2$) gas. When the precursor of the precursor gas is gaseous at a room temperature, the MFC 243 is a mass flow controller for gas.

A precursor gas supply part (which may be called a first gas supply system or a precursor gas supply part) 240 is mainly configured by the gas supply pipe 241, the MFC 243, the valve 244 and the nozzle 245. The precursor gas supply source 242 may be included in the precursor gas supply part 240.

Figure 7:
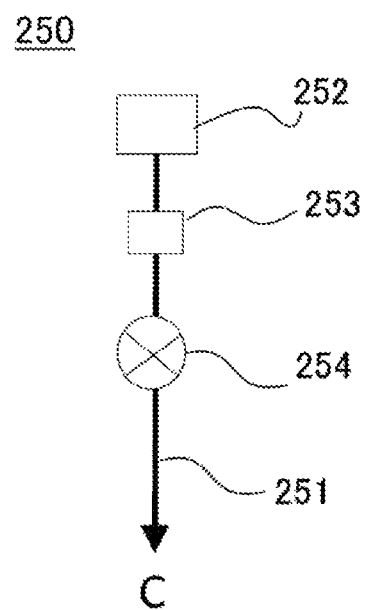
FIG. 7 is an explanatory view for explaining a reaction gas supply part according to an embodiment of the present disclosure.

Subsequently, the precursor gas supply part 250 will be described with reference to FIGS. 1 and 7. As described in FIG. 1, a nozzle 255 is inserted into the lateral side of the container 203 toward the center of the container 203. The nozzle 255 is disposed in the second process region 206b. "C" denoted in FIG. 1 corresponds to "C" denoted in FIG. 7 for connection.

A gas supply pipe 251 is connected to the nozzle 255. In the gas supply pipe 251, a reaction gas supply source 252, an MFC 253 as a flow rate controller (flow rate control part) and a valve 254 as an opening/closing valve are provided sequentially from the upstream side.

The reaction gas is supplied from the reaction gas supply source 252 into the second process region 206b through the MFC 253, the valve 254 and the nozzle 255.

The "reaction gas" referred to here is one of the process gases, and is a gas that reacts with a first layer formed on the substrate S by the precursor gas. The reaction gas is, for example, at least one selected from the group of an ammonia ($NH_3$) gas, a nitrogen ($N_2$) gas, a hydrogen ($H_2$) gas and an oxygen ($O_2$) gas. The reaction gas is, for example, an ammonia gas.

A reaction gas supply part (second gas supply part) 250 is mainly configured by the gas supply pipe 251, the MFC 253, the valve 254 and the nozzle 255. The reaction gas supply source 252 may be included in the reaction gas supply part 250.

Subsequently, the first inert gas supply part 260 will be described with reference to FIGS. 1 and 8. As shown in FIG. 1, a nozzle 265 and a nozzle 266 are inserted into the lateral side of the container 203 toward the center of the container 203. The nozzle 265 is a nozzle inserted into the first purge region 207a. For example, the nozzle 265 is fixed to the ceiling 208a of the first purge region 207a. The nozzle 266 is a nozzle inserted into the second purge region 207b. For example, the nozzle 266 is fixed to the ceiling 208b of the second purge region 207b.

Figure 8:
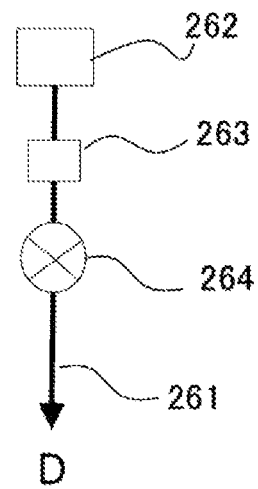
FIG. 8 is an explanatory view for explaining a first inert gas supply part according to an embodiment of the present disclosure.

"D" denoted in FIG. 1 corresponds to "D" denoted in FIG. 8 for connection. The downstream end of the inert gas supply pipe 261 is connected to the nozzle 265 and the nozzle 266. In the inert gas supply pipe 261, an inert gas supply source 262, an MFC 263 and a valve 264 are provided sequentially from the upstream side. The inert gas is supplied from the inert gas supply pipe 261 into the first purge region 207a and the second purge region 207b through the MFC 263, the valve 264, the nozzle 265 and the nozzle 266. The inert gas supplied into the first purge region 207a and the second purge region 207b acts as a purge gas.

A first inert gas supply part is mainly configured by the inert gas supply pipe 261, the MFC 263, the valve 264, the nozzle 265 and the nozzle 266. The inert gas supply source 262 may be included in the first inert gas supply part.

Subsequently, the second inert gas supply part 270 will be described with reference to FIGS. 2 and 9. "E" denoted in FIG. 2 corresponds to "E" denoted in FIG. 9 for connection to each other. The downstream end of the inert gas supply pipe 271 is connected to the inert gas supply pipe 275. In the inert gas supply pipe 271, an inert gas supply source 272, an MFC 273 and a valve 274 are provided sequentially from the upstream side. The inert gas is supplied from the inert gas supply pipe 271 to the space 284 and the container 204 via the MFC 273, the valve 274 and the inert gas supply pipe 275.

The inert gas supplied to the container 204 is exhausted from the exhaust groove 288 through the space between the substrate mounting plate 217 and the window 285. Such a structure prevents the precursor gas and the reaction gas from flowing into the space between the substrate mounting plate 217 and the window 285. Furthermore, even if the upper portion 286a comes into contact with the heat attenuator 297 and the heat attenuator 298 and generates particles due to the thermal expansion of the upper portion 286a, the particles can be exhausted from the exhaust groove 288 without allowing the particles to enter the process chamber 201.

A second inert gas supply part 270 is mainly configured by the inert gas supply pipe 271, the MFC 273, the valve 274 and the inert gas supply pipe 275. The inert gas supply source 272 may be included in the second inert gas supply part 270.

The "inert gas" referred to here is, for example, at least one of rare gases such as a nitrogen ($N_2$) gas, a helium (He) gas, a neon (Ne) gas and an argon (Ar) gas. In the present embodiment, the inert gas is, for example, an $N_2$ gas.

As shown in FIG. 1, the container 203 is provided with an exhaust port 291 and an exhaust port 292. The exhaust port 291 is provided on the downstream side of the process region 206a in the rotational direction. The exhaust port 291 mainly exhausts the precursor gas and the inert gas.

An exhaust pipe 234a which is a part of the exhaust part 234 is provided to communicate with the exhaust port 291. A vacuum pump 234b as an evacuation device is connected to the exhaust pipe 234a via a valve 234d as an opening/closing valve and an APC (Auto Pressure Controller) valve 234c as a pressure regulator (pressure regulation part). The vacuum pump 74 is configured to perform evacuation so that the pressure in the process chamber 201 becomes a predetermined pressure (vacuum degree).

The exhaust pipe 234a, the valve 234d and the APC valve 234c are collectively referred to as an exhaust part 234. The vacuum pump 234b may be included in the exhaust part 234.

Furthermore, as shown in FIGS. 1 and 2, an exhaust part 235 is provided to communicate with the exhaust port 292. The exhaust port 292 is provided on the downstream side of the process region 206b in the rotational direction. The exhaust port 292 mainly exhausts the reaction gas and the inert gas.

An exhaust pipe 235a which is a part of the exhaust part 235 is provided to communicate with the exhaust port 292. A vacuum pump 235b as an evacuation device is connected to the exhaust pipe 235a via a valve 235d as an opening/closing valve and an APC valve 235c as a pressure regulator (pressure regulation part). The vacuum pump 235b is configured to perform evacuation so that the pressure in the process chamber 201 becomes a predetermined pressure (vacuum degree).

The exhaust pipe 235a, the valve 235d and the APC valve 235c are collectively referred to as an exhaust part 235. The vacuum pump 235 b may be included in the exhaust part 235.

The reactor 200 includes a controller 300 that controls the operations of the respective parts. As shown in FIG. 10, the controller 300 includes at least an arithmetic part (CPU) 301, a temporary memory part 302, a memory part 303 and a transmission/reception part 304. The controller 300 is connected to the respective components of the substrate processing apparatus 10 via the transmission/reception part 304. The controller 300 calls a program or a recipe from the memory part 303 according to an instruction from a host controller or a user and controls the operations of the respective components according to the contents of the program or the recipe. The controller 300 may be configured as a dedicated computer or as a general-purpose computer. For example, the controller 300 according to the present embodiment may be configured by preparing an external memory device (e.g., a magnetic tape, a magnetic disk such as a flexible disk or hard disk, an optical disk such as a CD or a DVD, a magneto-optical disk such as an MO or the like, or a semiconductor memory such as a USB memory (USB Flash Drive) or a memory card) 312 which stores the aforementioned program, and installing the program in a general-purpose computer using the external memory device 312. Furthermore, the means for supplying the program to the computer is not limited to the case of supplying the program via the external memory device 312. For example, a communication means such as the Internet or a dedicated line may be used. Information may be received from a host device 320 via the transmission/reception part 311 and the program may be supplied without going through the external memory device 312. In addition, the controller 300 may be instructed by using an input/output device 313 such as a keyboard or a touch panel.

The memory part 303 or the external memory device 312 is configured as a computer-readable recording medium. Hereinafter, the memory part 303 and the external memory device 312 are collectively and simply referred to as a recording medium. When the term "recording medium" is used in the subject specification, it may indicate a case of including only the memory part 303, a case of including only the external memory device 312, or a case of including both the memory part 303 and the external memory device 312.

The CPU 301 is configured to read out and execute a control program from the memory part 303 and to read out a process recipe from the memory part 303 in response to an input of an operation command from the input/output device 313 or the like. The CPU 301 is configured to control the respective parts according to the contents of the read process recipe.

The controller 300 is not limited to being configured as a dedicated computer and may be configured as a general-purpose computer. For example, the controller 300 according to the present embodiment may be configured by preparing an external memory device (e.g., a magnetic tape, a magnetic disk such as a flexible disk or hard disk, an optical disk such as a CD or a DVD, a magneto-optical disk such as an MO or the like, or a semiconductor memory such as a USB memory (USB Flash Drive) or a memory card) 312 which stores the aforementioned program, and installing the program in a general-purpose computer using the external memory device 312. Furthermore, the means for supplying the program to the computer is not limited to the case of supplying the program via the external memory device 312. For example, a communication means such as the Internet or a dedicated line may be used and the program may be supplied without going through the external memory device 312. The memory part 303 or the external memory device 312 is configured as a computer-readable recording medium. Hereinafter, the memory part 303 and the external memory device 312 are collectively and simply referred to as a recording medium. When the term "recording medium" is used in the subject specification, it may indicate a case of including only the memory part 303, a case of including only the external memory device 312, or a case of including both the memory part 303 and the external memory device 312.

Figure 11:
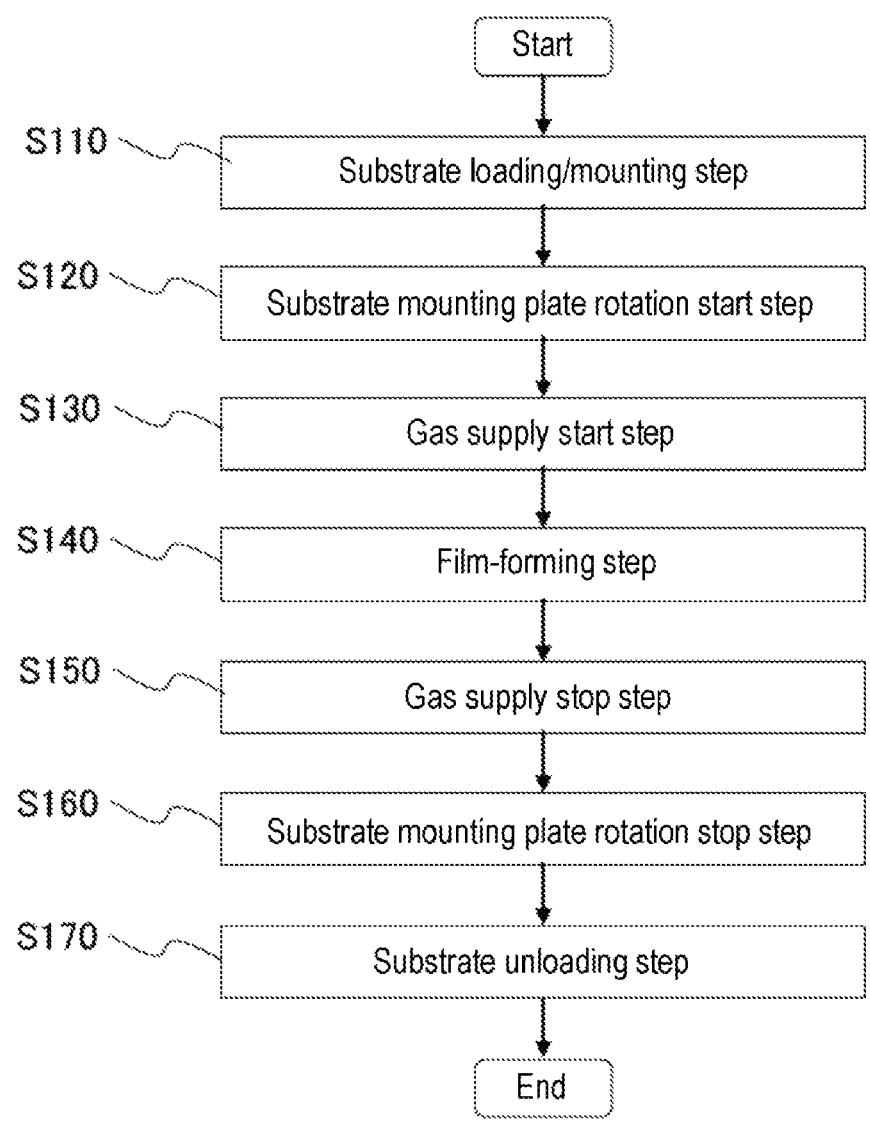
FIG. 11 is a flowchart for explaining a substrate processing process according to an embodiment of the present disclosure.
Figure 12:
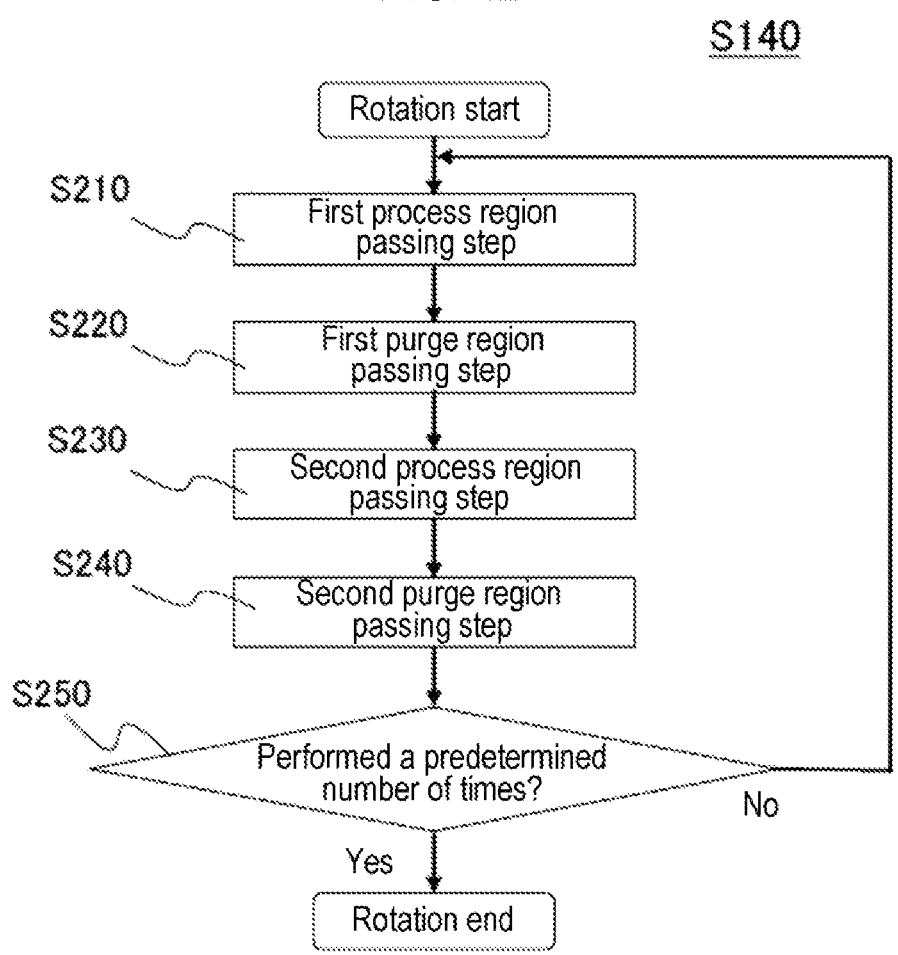
FIG. 12 is a flowchart for explaining the substrate processing process according to an embodiment of the present disclosure.

Next, a substrate processing process according to a first embodiment will be described with reference to FIGS. 11 and 12. FIG. 11 is a flowchart showing a substrate processing process according to the present embodiment. FIG. 12 is a flowchart showing a film-forming step according to the present embodiment. In the following description, the operations of the respective components of the reactor 200 of the substrate processing apparatus 10 are controlled by the controller 300.

Description will now be made on an example where a silicon nitride (SiN) film is formed as a thin film on the substrate S by using a $Si_2H_2Cl_2$ gas as a precursor gas and using an ammonia gas as a reaction gas.

A substrate loading/mounting step S110 will be described. In the reactor 200, the pins 219 are raised to penetrate the through holes 217a of the substrate mounting plate 217. As a result, the pins 219 protrude from the surface of the substrate mounting plate 217 by a predetermined height. Subsequently, the gate valve 205 is opened, and the substrate S is mounted on the pins 219 as shown in FIG. 3 using a substrate transfer machine (not shown). After mounting the substrate S, the pins 219 are lowered to mount the substrate S on the recess 217b.

Then, the substrate mounting plate 217 is rotated so that the recess 217b on which the substrate S is not mounted faces the gate valve 205. Thereafter, the substrate is similarly mounted in the recess 217b. This process is repeated until the substrates S are mounted in all the recesses 217b.

After the substrates S are loaded in the recesses 217b, the substrate transfer device is retracted out of the reactor 200, and the gate valve 205 is closed to seal the inside of the container 203.

When the substrate S is loaded into the process chamber 201, it is desirable that an $N_2$ gas as an inert gas is supplied into the process chamber 201 from the first inert gas supply part 260 while exhausting the inside of the process chamber 201 by the exhaust parts 234 and 235. As a result, it is possible to suppress particles from entering the process chamber 201 and to suppress particles from adhering to the substrate S. The vacuum pumps 234b and 235b are always operated at least from the substrate loading/mounting step (S110) to the end of the substrate unloading step (S170) described later.

When mounting the substrate S on the substrate mounting plate 217, electric power is supplied to the heater 280 in advance so that the surface of the substrate S is controlled to have a predetermined temperature. The temperature of the substrate S is, for example, not less than the room temperature and not more than 650 degrees C., preferably not less than the room temperature and not more than 400 degrees C. The heater 280 is constantly supplied with electric power at least from the substrate loading/mounting step (S110) to the end of the substrate unloading step (S170) described later.

At the same time, the inert gas is supplied from the second inert gas supply part 270 to the container 204 and the heater unit 281. The inert gas is supplied at least from the substrate loading/mounting step (S110) to the end of the substrate unloading step (S170) described later.

A substrate mounting plate rotation start step S120 will be described. When the substrate S is mounted in each recess 217b, the rotation part 224 is controlled to rotate the substrate mounting plate 217 in the R direction. By rotating the substrate mounting plate 217, the substrate S moves in the order of the first process region 206a, the first purge region 207a, the second process region 206b and the second purge region 207b.

A gas supply start step S130 will be described. When the substrate S is heated to reach a desired temperature and the substrate mounting plate 217 reaches a desired rotation speed, the valve 244 is opened to start supply of a $Si_2H_2Cl_2$ gas into the first process region 206a. At the same time, the valve 254 is opened to supply an ammonia gas into the second process region 206b.

At this time, the MFC 243 is adjusted so that the flow rate of the $Si_2H_2Cl_2$ gas becomes a predetermined flow rate. The supply flow rate of the $Si_2H_2Cl_2$ gas is, for example, 50 sccm or more and 500 sccm or less.

Furthermore, the MFC 253 is adjusted so that the flow rate of the ammonia gas becomes a predetermined flow rate. The supply flow rate of the ammonia gas is, for example, 100 sccm or more and 5000 sccm or less.

After the substrate loading/mounting step S110, the inside of the process chamber 201 is continuously exhausted by the exhaust parts 234 and 235, and the $N_2$ gas as the purge gas is supplied from the first inert gas supply part 260 into the first purge region 207a and the second purge region 207b. Furthermore, the pressure in the process chamber 201 is set to a predetermined pressure by appropriately adjusting the opening degree of the APC valve 234c and the APC valve 235c.

A film-forming step S140 will be described. The basic flow of the film-forming step S140 will be described here, and the details thereof will be described later. In the film-forming step S140, a silicon-containing layer is formed on each substrate S in the first process region 206a. The silicon-containing layer and the ammonia gas react with each other in the second process region 206b coming after further rotation, thereby forming a silicon nitride film on the substrate S. The substrate mounting plate 217 is rotated a predetermined number of times so as to obtain a desired film thickness.

A gas supply stop step S150 will be described. After rotating the substrate mounting plate 217 a predetermined number of times, the valves 244 and 254 are closed to stop the supply of the $Si_2H_2Cl_2$ gas to the first process region 206a and the supply of the $NH_3$ gas to the second process region 206b.

The substrate mounting plate rotation stop step S160 will be described. After the gas supply stop step S150, the rotation of the substrate mounting plate 217 is stopped.

A substrate unloading step S170 will be described. The substrate mounting plate 217 is rotated to move the substrate S to a position facing the gate valve 205. Thereafter, the substrate S is supported on the pins 219 in the same manner as when the substrate S is loaded. Thereafter, the gate valve 205 is opened, and the substrate S is unloaded from the container 203 using a substrate transfer machine (not shown). This process is repeated by the number of substrates S processed, thereby unloading all the substrates S. Thereafter, the supply of the inert gas by the first inert gas supply part 260 and the second inert gas supply part 270 is stopped.

Subsequently, the details of the film-forming step S140 will be described with reference to FIG. 12. From a first process region passing step S210 to a second purge region passing step S240, one of the plurality of substrates S mounted on the substrate mounting plate 217 will be mainly described.

As shown in FIG. 12, in the film-forming step S140, by the rotation of the substrate mounting plate 217, the substrates S are caused to sequentially pass through the first process region 206a, the first purge region 207a, the second process region 206b and the second purge region 207b.

A first process region passing step S210 will be described. The $Si_2H_2Cl_2$ gas is supplied to the substrate S when the substrate S passes through the first process region 206a. At this time, since there is no reaction gas in the first process region 206a, the $Si_2H_2Cl_2$ gas makes direct contact with (adheres to) the surface of the substrate S without reacting with the reaction gas. Thus, a first layer is formed on the surface of the substrate S.

A first purge region passing step S220 will be described. The substrate S moves to the first purge region 207a after passing through the first process region 206a. When the substrate S passes through the first purge region 207a, the component of $Si_2H_2Cl_2$ which has failed to form a strong bond on the substrate S in the first process region 206a is removed from the substrate S by the inert gas.

A second process region passing step S230 will be described. The substrate S moves to the second process region 206b after passing through the first purge region 207a. When the substrate S passes through the second process region 206b, the first layer reacts with the ammonia gas as a reaction gas in the second process region 206b. Thus, a second layer containing at least Si and N is formed on the substrate S.

A second purge region passing step S240 will be described. After passing through the second process region 206b, the substrate S moves to the second purge region 207b. When the substrate S passes through the second purge region 207b, HCl desorbed from the third layer on the substrate S in the second process region 206c, an excess $H_2$ gas, and the like are removed from the substrate S by the inert gas.

In this way, at least two reaction gases that react with each other are sequentially supplied to the substrate. The first process region passing step S210, the first purge region passing step S220, the second process region passing step S230 and the second purge region passing step S240 constitute one cycle.

A determination step S250 will be described. The controller 300 determines whether the one cycle has been performed a predetermined number of times. Specifically, the controller 300 counts the number of revolutions of the substrate mounting plate 217.

If the aforementioned one cycle is not performed a predetermined number of times (if NO in S250), the rotation of the substrate mounting plate 217 is further continued to repeat the cycle including the first process region passing step S210, the first purge region passing step S220, the second process region passing step S230 and the second purge region passing step S240. By stacking layers in this way, a thin film is formed.

If the aforementioned one cycle is performed a predetermined number of times (if YES in S250), the film-forming step S140 is ended. Thus, a thin film having a predetermined film thickness is formed by performing the aforementioned one cycle a predetermined number of times.

In the present embodiment, there has been described the example in which the ammonia gas is used as the reaction gas. However, the present disclosure is not limited thereto.

While the embodiment of the present disclosure has been concretely described above, the present disclosure is not limited to the above-described embodiment and may be variously modified without departing from the gist thereof.

In the above-described embodiment, there has been described the case where the $Si_2H_2Cl_2$ gas is used as the precursor gas, the ammonia gas is used as the reaction gas, and the SiN film is formed as the nitride film on the substrate S. However, a $SiH_4$ gas, a $Si_2H_6$ gas, a $Si_3H_8$ gas, an aminosilane gas or a TSA gas may be used as the precursor gas. An $O_2$ gas may be used as the reaction gas to form an oxide film. Another nitride film such as a TaN film or a TiN film, an oxide film such as a HfO film, a ZrO film or a SiO film, or a metal film such as a Ru film, a Ni film or a W film may be formed on the substrate S. In the case of forming a TiN film or a TiO film, for example, a tetrachlorotitanium ($TiCl_4$) gas or the like may be used as the precursor gas.

According to the substrate processing apparatus and the method of manufacturing a semiconductor device of the present disclosure, it is possible to reduce the influence of thermal expansion in a rotary apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a metal container including a process chamber configured to process a substrate;
   a substrate mounting plate rotatably installed in the metal container and having a plurality of substrate mounting surfaces circumferentially arranged at an upper surface of the substrate mounting plate;
   a heater configured to heat the substrate mounted on each of the plurality of substrate mounting surfaces;
   a heat attenuator installed between the heater and the metal container;
   a gas supply part configured to supply a gas to the process chamber; and
   a support part configured to rotate the substrate mounting plate, and including:
      a metal core portion configured to fix the substrate mounting plate; and
      a second cover disposed between the metal core portion and the process chamber,
   wherein the heat attenuator is installed on the second cover and configured to be adjacent to the metal core portion via a space.

2. The apparatus of claim 1, wherein a heater unit, which is isolated from an atmosphere in the process chamber and constituted with a metal wall, a quartz window and the heater, is installed at a bottom portion of the metal container.

3. The apparatus of claim 2, wherein a metal exhaust structure and a first cover adjacent to the metal exhaust structure are installed at the bottom portion of the metal container.

4. The apparatus of claim 3, wherein the heat attenuator is constituted as a cover coated with fine quartz particles on a surface of the cover.

5. The apparatus of claim 2, wherein the heat attenuator is configured as a cover coated with fine quartz particles on a surface of the cover.

6. The apparatus of claim 1, wherein a metal exhaust structure and a first cover adjacent to the metal exhaust structure are installed at a bottom portion of the metal container.

7. The apparatus of claim 6, wherein the heat attenuator is constituted as a cover coated with fine quartz particles on a surface of the cover.

8. The apparatus of claim 1, wherein the heat attenuator is constituted as a cover coated with fine quartz particles on a surface of the cover.

* * * * *